(12) United States Patent
Zhang et al.

(10) Patent No.: US 11,167,542 B2
(45) Date of Patent: Nov. 9, 2021

(54) PRINTING MASK AND METHOD OF PRINTING ADHESIVE PATTERN

(71) Applicants: Ordos Yuansheng Optoelectronics Co., Ltd., Inner Mongolia (CN); BOE Technology Group Co., Ltd., Beijing (CN)

(72) Inventors: Liang Zhang, Beijing (CN); Xu Chen, Beijing (CN); Chunchieh Huang, Beijing (CN); Shanshan Bao, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 344 days.

(21) Appl. No.: 16/319,572

(22) PCT Filed: Feb. 6, 2018

(86) PCT No.: PCT/CN2018/075416
§ 371 (c)(1),
(2) Date: Jan. 22, 2019

(87) PCT Pub. No.: WO2019/007057
PCT Pub. Date: Jan. 10, 2019

(65) Prior Publication Data
US 2020/0198321 A1    Jun. 25, 2020

(30) Foreign Application Priority Data
Jul. 5, 2017   (CN) .......................... 201710544163.X

(51) Int. Cl.
*B41F 15/36*    (2006.01)
*H01L 51/52*    (2006.01)
(Continued)

(52) U.S. Cl.
CPC ............ *B41F 15/36* (2013.01); *B41F 19/004* (2013.01); *B41M 1/12* (2013.01); *B41M 3/003* (2013.01);
(Continued)

(58) Field of Classification Search
CPC ....... B41F 15/36; B41F 19/004; B41M 3/003; B41M 3/006; B41M 1/12; H01L 51/5246
See application file for complete search history.

(56) References Cited

U.S. PATENT DOCUMENTS 7,105,277 B2   9/2006   Takenaka et al.
8,211,494 B2   7/2012   Takenaka et al.
(Continued)

FOREIGN PATENT DOCUMENTS

CN   1564755 A   1/2005
CN   1739322 A   2/2006
(Continued)

OTHER PUBLICATIONS

First Office Action, including Search Report, for Chinese Patent Application No. 201710544163.X, dated Sep. 3, 2018, 15 pages.
(Continued)

*Primary Examiner* — Matthew G Marini
*Assistant Examiner* — Marissa Ferguson-Samreth
(74) *Attorney, Agent, or Firm* — Westman, Champlin & Koehler, P.A.

(57) ABSTRACT

The present disclosure provides a printing mask and a method of printing an adhesive pattern with the printing mask. The printing mask includes: a screen including: an annular permeable region through which an adhesive permeates; and a barrier region which surrounds the annular permeable region and stops a permeation of the adhesive through the barrier region, the annular permeable region including an adjustment sub-region configured to increase a
(Continued)

permeability of the adhesive, and the barrier region including barrier sub-regions respectively located on an inner side and an outer side of the corresponding adjustment sub-region; a first film covering a side of the barrier region; and a second film covering sides of the barrier sub-regions facing away from the first film.

17 Claims, 4 Drawing Sheets

(51) Int. Cl.
*B41M 1/12* (2006.01)
*B41M 3/00* (2006.01)
*B41F 19/00* (2006.01)

(52) U.S. Cl.
CPC .......... *B41M 3/006* (2013.01); *H01L 51/5246* (2013.01)

(56) References Cited

U.S. PATENT DOCUMENTS

| | | | |
|---|---|---|---|
| 9,050,790 B2 | 6/2015 | Kawai et al. | |
| 9,673,426 B2 | 6/2017 | Wu | |
| 2004/0248041 A1 | 12/2004 | Takenaka et al. | |
| 2006/0115583 A1 | 6/2006 | Takenaka et al. | |
| 2012/0248950 A1* | 10/2012 | Niibori | H01L 51/5246 312/223.1 |
| 2013/0145941 A1 | 6/2013 | Kawai et al. | |
| 2015/0280167 A1* | 10/2015 | Zhang | H01L 51/524 257/40 |
| 2016/0359146 A1 | 12/2016 | Wu | |
| 2017/0194597 A1* | 7/2017 | Pang | H01L 23/564 |
| 2017/0278897 A1* | 9/2017 | Ao | H01L 33/641 |
| 2017/0348962 A1 | 12/2017 | Xiao | |

FOREIGN PATENT DOCUMENTS

| | | | |
|---|---|---|---|
| CN | 101048031 A | 10/2007 | |
| CN | 103158341 A | 6/2013 | |
| CN | 104332450 A | 2/2015 | |
| CN | 105116687 A | 12/2015 | |
| CN | 107264008 A | 10/2017 | |
| EP | 1 587 351 A1 | 10/2005 | |
| EP | 1 428 677 B1 | 4/2007 | |
| EP | 1 780 034 B1 | 9/2008 | |
| EP | 2 604 433 B1 | 11/2016 | |
| JP | 09248975 * | 9/1997 | ............... B41N 1/24 |
| JP | 2015-182324 A | 10/2015 | |
| JP | 2016-129954 A | 7/2016 | |
| WO | 2016/019274 A1 | 2/2016 | |

OTHER PUBLICATIONS

International Search Report (including English translation) and Written Opinion (English translation of Box V) for International Application No. PCT/CN2018/075416, dated May 14, 2018, 13 pages.

\* cited by examiner

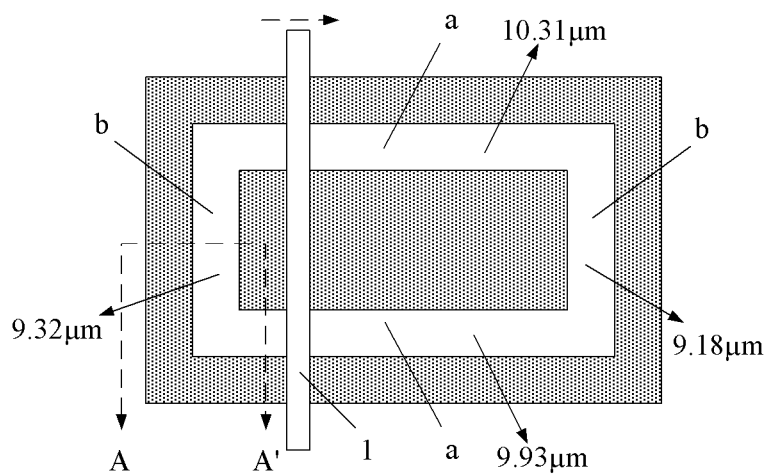
FIG. 1- Prior Art
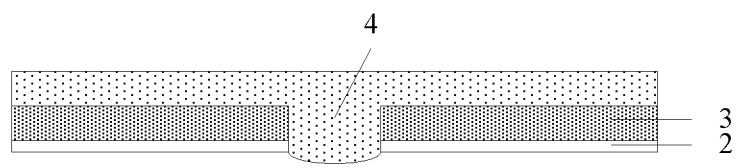
FIG. 2- Prior Art

PRINTING MASK AND METHOD OF PRINTING ADHESIVE PATTERN

CROSS-REFERENCE TO RELATED APPLICATION

This application is a Section 371 National Stage Application of International Application No. PCT/CN2018/075416, filed on 6 Feb. 2018, entitled "PRINTING MASK AND METHOD OF PRINTING ADHESIVE PATTERN", which has not yet published, which claims priority to Chinese Application No. 201710544163.X, filed on 5 Jul. 2017, incorporated herein by reference in their entirety.

TECHNICAL FIELD

Embodiments of the present invention relate generally to the field of display, and particularly to a printing mask and a method of printing an adhesive pattern.

BACKGROUND

A body of a printing mask is composed of a screen frame and a screen stretched by the screen frame. A portion of the screen which is coated with an emulsion having a high viscosity forms a barrier region, while the other portion of the screen which is not coated with the emulsion forms a feed opening or a permeable region. The printing mask is accurately aligned with a substrate to be printed. Then, an adhesive to be printed such as a glass glue is coated on the printing mask. A scraper is scraped along the printing mask to apply a pressure, so that the adhesive such as the glass glue permeates through the feed opening to be transferred onto a corresponding area on the substrate, thereby forming a particular pattern of the adhesive such as the glass glue on the substrate.

In order not to affect an application of the pressure and a movement of the scraper in a printing process, the emulsion of the mask formed on the screen is simple, that is, a thickness of the emulsion is uniform everywhere, so that an actual depth of the feed opening is also uniform everywhere, that is, a thickness of the glass glue permeating through the feed opening onto the substrate should also be uniform everywhere. However, in practical applications of the adhesive, when a conventional printing mask is used, an actual thickness uniformity of the pattern of the glass glue formed on the entire substrate is poor due to a limitation imposed by a structure of the mask and influence of factors such as technology or operation.

In particular, when the pattern of the glass glue to be formed is a pattern of a frame sealing adhesive applied in a display apparatus, there is a height difference between a portion of the frame sealing adhesive having a smaller thickness and a support column in a display area, so that a Newton ring-shaped halo appears at an edge of a screen in a position corresponding to this portion of the frame sealing adhesive, which has an influence on a display quality. Especially when a red picture is displayed on the screen, the Newton ring is more serious due to a longer wavelength of a red light wave, which has a greater influence on the display quality.

SUMMARY

In an aspect, embodiments of the present disclosure provide a printing mask comprising:

a screen comprising: an annular permeable region through which an adhesive permeates; and a barrier region which surrounds the annular permeable region and stops a permeation of the adhesive through the barrier region, the annular permeable region comprising an adjustment sub-region configured to increase a permeability of the adhesive, and the barrier region comprising barrier sub-regions respectively located on an inner side and an outer side of the corresponding adjustment sub-region; a first film covering a side of the barrier region; and a second film covering sides of the barrier sub-regions facing away from the first film.

In some embodiments, an edge of a profile of each of the barrier sub-regions and an edge, close to the edge of the profile of the each of the barrier sub-regions, of a profile of the corresponding adjustment sub-region are completely coincident with each other.

In some embodiments, an orthogonal projection of the first film on a plane where the screen is located and an orthogonal projection of the barrier region on the plane are completely coincident with each other; and/or an orthogonal projection of the second film on the plane where the screen is located and an orthogonal projection of the barrier sub-regions on the plane are completely coincident with each other.

In some embodiments, the annular permeable region has a quadrangular shape, and the quadrangular shape comprises: two first sides arranged to be non-parallel to a moving direction of a scrape coating device; and two second sides arranged to be parallel to the moving direction; and the annular permeable region comprises: two first sub-regions which define the first sides of the quadrangular shape and at least one of which serves as the adjustment sub-region; and two second sub-regions which define the second sides of the quadrangular shape.

In some embodiments, the barrier sub-regions respectively located on the inner side and the outer side of the adjustment sub-region are spaced from the second sub-regions.

In some embodiments, a thickness of the second film is set according to angles between the first sides and the moving direction arranged to be non-parallel to the first sides.

In some embodiments, a width of each of the barrier sub-regions measured in the moving direction is greater than or equal to 0.2 mm, and/or a spacing between the barrier sub-regions and each of the second sub-regions is greater than 0.5 mm.

In some embodiments, the annular permeable region comprises a circular annular permeable region, an outer ring of the circular annular permeable region has a first diameter arranged to be parallel to a moving direction of a scrape coating device and comprises two first inferior arcs intersecting the first diameter and opposite to each other, and an inner ring of the circular annular permeable region comprises two second inferior arcs intersecting the first diameter and opposite to each other; and the adjustment sub-region comprises at least one of two regions defined by the first inferior arcs and the second inferior arcs.

In some embodiments, the annular permeable region comprises a annular permeable region constituted by a combination of arc-shaped segments and straight line-shaped segments, and the annular permeable region comprises two straight line-shaped segments opposite to each other and arranged to be non-parallel to a moving direction of a scrape coating device, and two arc-shaped segments connecting the two straight line-shaped segments and opposite to each other; and the adjustment sub-region comprises at least one of the two straight line-shaped segments.

In some embodiments, the second film has a thickness of 2 μm-25 μm.

In some embodiments, a material of the second film comprises an emulsion that is incapable of reacting with an adhesive to be printed.

In some embodiments, a material of the first film is the same as a material of the second film.

In another aspect, embodiments of the present disclosure provide a method of printing an adhesive pattern, comprising:

aligning the annular permeable region of the printing mask described in any one of the embodiments of the present disclosure with a printed region on a substrate to be printed, wherein one side of the printing mask on which the second film is provided faces towards the substrate to be printed;

coating an adhesive on the other side of the printing mask on which the first film is provided; and moving a scrape coating device in a direction which is non-parallel to the adjustment sub-region to scrape-coat the adhesive so that the adhesive permeates through the annular permeable region onto the substrate, thereby forming the adhesive pattern in the printed region.

In some embodiments, the adhesive comprises a glass glue.

In some embodiments, the method further comprises separating the printing mask from the substrate after the adhesive pattern is formed.

BRIEF DESCRIPTION OF THE DRAWINGS

In order to describe embodiments of the present disclosure or technical solutions in the prior art more clearly, accompanying drawings required for describing the embodiments or the prior art will be simply explained as below. Apparently, the accompanying drawings for the following description are only some embodiments of the present disclosure. Those skilled in the art also could derive other accompanying drawings from these accompanying drawings without making a creative work.

FIG. 1 is a schematic view showing a printing process with a conventional printing mask;

FIG. 2 is a structural schematic sectional view taken along the direction A-A' in FIG. 1;

DETAILED DESCRIPTION

Figure 3:
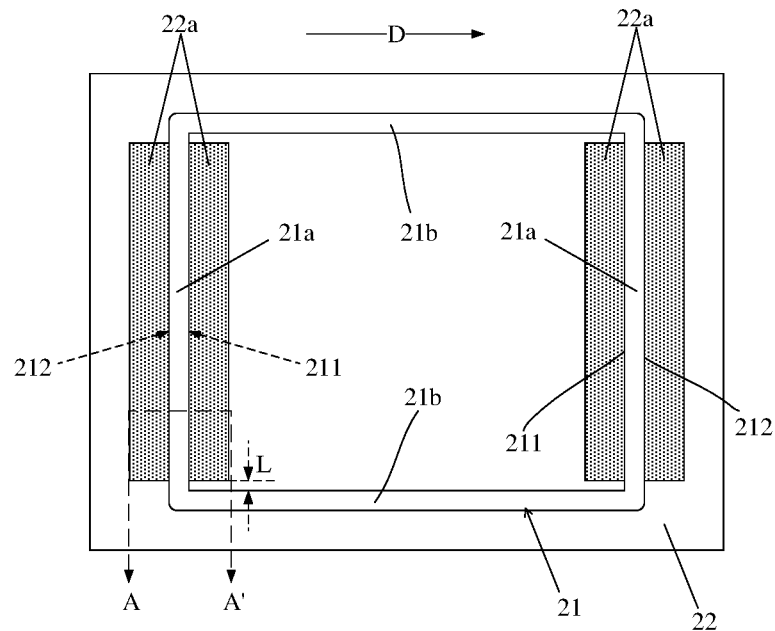
FIG. 3 is a schematic plan view showing a structure of a printing mask according to an embodiment of the present disclosure.

A clear and complete description of technical solutions in embodiments of the present disclosure will be made as below in conjunction with the accompanying drawings in the embodiments of the present disclosure. Apparently, the described embodiments are merely some of the embodiments of the present disclosure rather than all of the embodiments of the present disclosure. All other embodiments derived by those skilled in the art based on the embodiments of the present disclosure without making a creative work shall fall within the protection scope of the present disclosure.

It should be noted that unless otherwise defined, all terms (including technical and scientific terms) used herein have the same meaning as commonly understood by one of ordinary skill in the art to which the present disclosure pertains. It should be further understood that terms, such as those defined in commonly used dictionaries, should be interpreted as having a meaning that is consistent with their meaning in the context of the relevant art, and should not be interpreted in an idealized or overly formal sense, unless expressly so defined herein.

For example, the terms "first" and "second" and similar words and phrases used herein are used for only distinguishing different components from one another rather than indicating any sequence, number or importance. The term "comprises", "comprising", "includes", "including" or any other similar word or phrase is to be construed to specify that an element or article that appears before the term covers an element or article that appears after the term and is listed and its equivalent, but does not exclude other elements or articles. Orientations or positional relationships indicated by terms such as "over/above", "under/below", "on one side", and "on the other side" are based on orientations or positional relationships shown in the accompanying drawings, and are merely used to facilitate description of technical solutions of the present disclosure and simplification of the description, but do not indicate or imply that a specified device or an element must have the particular orientation and must be configured and operated in the particular orientation. Therefore, the orientations or positional relationships should not be construed to limit the present disclosure.

FIG. 1 shows a printing process with a conventional printing mask. In FIG. 1, a scraper 1 moves from one side to the other side of the printing mask in a moving direction (i.e. a printing direction) indicated by an arrow shown in FIG. 1, thereby applying a pressure. A feed opening has an annular shape. Therefore, different portions of the feed opening or the permeable region receive different actual forces applied by the scraper due to a limitation imposed by this movement manner of the scraper. Specifically, a portion (indicated by "a" in FIG. 1) of the feed opening perpendicular to the scraper receives a smaller pressure applied by the scraper in scraping operation. In other words, a smaller amount of adhesive is scraped away from the portion of the feed opening during movement of the scraper 1, so that a thickness of the glass glue transferred from the portion of the feed opening onto the substrate is greater. For example, the thickness is 10.31 μm and 9.93 μm as shown in FIG. 1. However, a portion (indicated by "b" in FIG. 1) of the feed opening parallel to the scraper 1 receives a greater pressure applied by the scraper 1 in scraping operation. In other words, a greater amount of adhesive is scraped away from the portion of the feed opening during movement of the scraper 1, so that a thickness of the glass glue transferred from the portion of the feed opening onto the substrate is smaller. For example, the thickness is 9.32 μm and 9.18 μm as shown in FIG. 1. As a result, an actual thickness uniformity of a pattern of the glass glue formed on the entire substrate is poor.

As shown in FIGS. 3-7, embodiments of the present disclosure provide a printing mask. The printing mask includes a screen 2. The screen 2 includes: an annular permeable region 21 through which an adhesive permeates; and a barrier region 22 which surrounds the annular permeable region 21 and stops a permeation of the adhesive through the barrier region 22. A portion of the annular permeable region 21 is an adjustment sub-region 21a configured to increase a permeability of the adhesive. The barrier region 22 includes barrier sub-regions 22a respectively located on both sides of the adjustment sub-region 21a, for example an inner side and an outer side of an annular shape defined by the annular permeable region. The printing mask further includes: a first film 23 (only illustrated in FIGS. 7-8) covering the barrier region; and a second film 24 (only illustrated in FIGS. 7-8) covering sides of the barrier sub-regions facing away from the first film 23. In some embodiments, an edge of a profile of each of the barrier sub-regions 22a and an edge, close to the edge of the profile of the each of the barrier sub-regions 22a, of a profile of the adjustment sub-region 21a are completely coincident with each other. For example, a shape of an orthogonal projection of the barrier sub-regions on a plane where the screen is located and a shape of an orthogonal projection of the adjustment sub-region on the plane are complementary or form a continuous pattern or shape. In some other embodiments, an orthogonal projection of the first film on the plane where the screen is located and an orthogonal projection of the barrier region on the plane are completely coincident with each other, and an orthogonal projection of the second film on the plane where the screen is located and an orthogonal projection of the barrier sub-regions on the plane are completely coincident with each other.

The following should be noted: First of all, a specific shape of the annular permeable region of the printing mask according to the embodiment of the present disclosure includes, but not limited to, for example a rectangular annular shape shown in FIGS. 3-4, for example a circular annular shape shown in FIG. 5, and for example an annular shape constituted by a combination of arcs and straight lines shown in FIG. 6. The edge of the profile of each of the barrier sub-regions 22a and the edge, close to the edge of the profile of the each of the barrier sub-regions 22a, of the profile of the adjustment sub-region 21a are completely coincident with each other. However, in the case where an error of a spacing between the edges of the profiles generated due to reasons such as technology is within an allowable range, the edges of the profiles also belong to the case where they are completely coincident with each other.

Secondly, a feed opening through which an adhesive permeates has an annular shape. In other words, the feed opening has an inside annular edge 211 and an outside annular edge 212 which are opposite to each other. The barrier sub-regions 22a are located on an inner side and an outer side of the adjustment sub-region 21a. For example, FIG. 3 is taken as an example. FIG. 3 shows adjustment sub-regions 21a on left and right sides. Two corresponding barrier sub-regions 22a are disposed on both sides of each of the adjustment sub-regions 21a. A first-from-left barrier sub-region 22a is located on an outer side of a left adjustment sub-region 21a (a left side of the left adjustment sub-region 21a in FIG. 3, i.e. a left side of the outside annular edge 212), and a second-from-left barrier sub-region 22a is located on an inner side of the left adjustment sub-region 21a (a right side of the left adjustment sub-region 21a in FIG. 3, i.e. a right side of the inside annular edge 211). Likewise, a third-from-left barrier sub-region 22a is located on an inner side of a right adjustment sub-region 21a (a left side of the right adjustment sub-region 21a in FIG. 3), and a fourth-from-left barrier sub-region 22a is located on an outer side of the right adjustment sub-region 21a (a right side of the right adjustment sub-region 21a in FIG. 3). Thereby, each of the two adjustment sub-regions 21a is sandwiched between corresponding two barrier sub-regions such that the two barrier sub-regions are located on an inner side and an outer side of the each of the two adjustment sub-regions, respectively.

Thirdly, the term "profile" used in the embodiment of the present disclosure includes an edge line defining an extent of an object. The object includes the barrier sub-region 22a, the adjustment sub-region 21a, and the like. The edge of the profile of each of the barrier sub-regions 22a and the edge, close to the edge of the profile of the each of the barrier sub-regions 22a, of the profile of the adjustment sub-region 21a are completely coincident with each other. For example, referring to the opposite arrows shown in FIGS. 3 to 6, an edge line of each of the barrier sub-regions 22a and an edge line, close to the edge line of the each of the barrier sub-regions 22a, of the adjustment sub-region 21a are completely coincident with each other with no vacant area between the edge lines.

Figure 7:
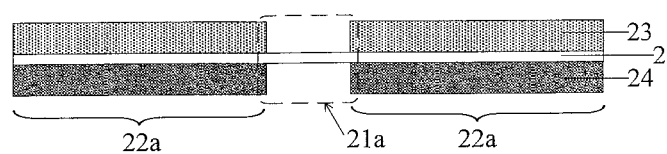
FIG. 7 is a structural schematic sectional view taken along the direction A-A' in FIG. 3.

Here, further referring to a sectional structure shown in FIG. 7, the first film 23 covering the barrier region 22 and the second film 24 covering the barrier sub-regions 22a correspond to or are aligned with each other in an up-down direction or a vertical direction at a position close to an edge of the annular permeable region 21. Thereby, a depth or thickness of the adjustment sub-region 21a, configured to increase the permeability of the adhesive, of the annular permeable region 21 is increased by an amount equal to a thickness of the second film 24, with respect to the other portion of the annular permeable region 21. In other words, the adjustment sub-region 21a extends downwards by the amount equal to the thickness of the second film 24, with respect to the other portion of the annular permeable region 21.

As shown in FIG. 2, an actual depth or thickness of a feed opening or a permeable region of a conventional printing mask is determined only by a thickness of an emulsion 3 covering a side of a screen 2 and a thickness of the screen 2 itself, while the thickness of the emulsion 3 on the screen 2 is uniform throughout. In other words, the annular permeable region has the same depth or thickness in different regions. However, forces applied by a scraper to different regions of the screen are different. Thereby, amounts of adhesive liquid or adhesive permeating through different positions of the feed opening or the permeable region of the printing mask are different. As a result, a problem that a thickness of a printed adhesive is ununiform occurs when the scraper is moved on the printing mask.

Figure 8:
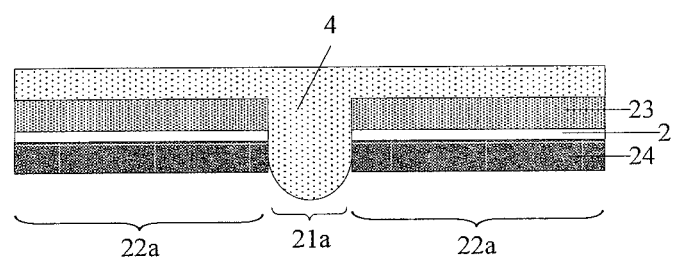
FIG. 8 is a schematic view showing a penetration of an adhesive when a printing is performed with a printing mask according to an embodiment of the present disclosure.

In the printing mask according to the embodiment of the present disclosure, as shown in FIG. 8, on a back side of the screen 2, the second film 24 is added to the inner side and the outer side of the adjustment sub-region, where the permeability of the adhesive needs to be increased, of the annular permeable region. The addition of the second film is equivalent to an increase of a feed depth of the adjustment sub-region when the adhesive permeates, compared with a conventional structure. Thereby, more adhesive 4 can permeate into the adjustment sub-region in a pre-coating process of the adhesive so as to be transferred onto the substrate in a subsequent printing process. In addition, a purpose of adjusting a whole thickness uniformity of a printed adhesive pattern can be achieved by adjusting a thickness of the added second film 24.

Here, a shape of each of the added barrier sub-regions 22a (or the corresponding second films 24) includes, but not limited to, a rectangular shape, a sectorial shape or an elliptic shape shown in FIGS. 3-6. Further, the barrier sub-regions 22a (or the corresponding second films 24) located on the inner sides and the outer sides of the adjustment sub-regions 21a may have the same shape or different shapes, and further, the barrier sub-regions 22a (or the corresponding second films 24) corresponding to each of the adjustment sub-regions 21a may have the same shape or different shapes. There is no limitation on specific pattern, shape, symmetrical manner and the like of each of the barrier sub-regions 22a in the embodiment of the present disclosure as long as the edge of the profile of each of the barrier sub-regions 22a and the edge, close to the edge of the profile of the each of the barrier sub-regions 22a, of the profile of the adjustment sub-region 21a are completely coincident with each other.

In the printing mask according to the embodiment of the present disclosure, on a back side of the screen, the second film is added in a region in which the permeability of the adhesive needs to be increased, and which may be arranged to be non-parallel to a moving direction of a scrape coating device (i.e. a region arranged to be non-perpendicular to the scrape coating device (for example a scraper)) for example, thereby increasing an actual feed depth of this region, increasing the permeability of the adhesive in this region, and solving or alleviating the problem of ununiformity of the permeability of the adhesive in different regions due to the ununiformity of the force caused when the scrape coating device is in contact with a screen having an emulsion with a uniform thickness. As a result, a permeability of an adhesive in a region which otherwise has a smaller permeability of the adhesive is increased, so that a printed adhesive pattern has a uniform thickness. In addition, since the second film is formed on the back side of the screen, it does not affect an application of a pressure and a travel of the scrape coating device on a front side of the screen (i.e. a side on which the first film is formed). Further, when the printing mask according to the embodiment of the present disclosure is used to form a pattern of a frame sealing adhesive around a display area of a display substrate, a thickness uniformity of the formed frame sealing adhesive is good and there is no (or a smaller) height difference between the frame sealing adhesive and a support column in the display area, thereby avoiding an appearance of a Newton ring-shaped halo at an edge of a screen in a position corresponding to the frame sealing adhesive. As a result, a display quality is guaranteed.

In some embodiments, in consideration that in a conventional technology, a process in which the printing mask is used is mainly utilized to form a pattern of a glass glue on the substrate, a designed height of the glass glue is generally 10 μm. Therefore, the thickness of the added second film 24 may be designed or adjusted to be 2 μm-25 μm to be adapted to the designed height of the glass glue.

In an embodiment, the second film 24 is formed of an emulsion that is incapable of reacting with an adhesive to be printed, and in order to simplify a manufacturing process of the printing mask, the first film 23 and the second film 24 may be formed of the same material.

Figure 4:
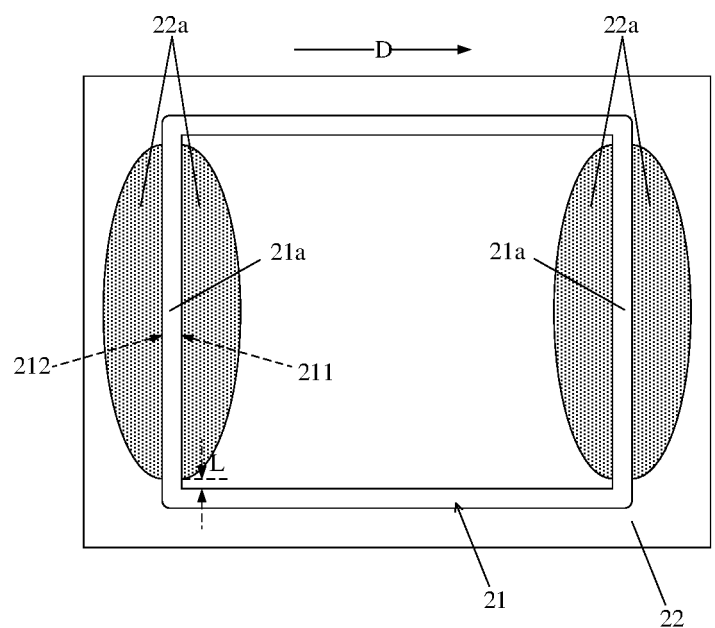
FIG. 4 is a schematic plan view showing a structure of a printing mask according to another embodiment of the present disclosure.

In an embodiment, referring to FIGS. 3 and 4, the annular permeable region 21 may be an annular permeable region having a quadrangular shape or profile, and the quadrangular shape includes: two first sides arranged to be non-parallel to the moving direction (indicated by the arrow D in FIGS. 3 and 4) of the scrape coating device; and two second sides arranged to be parallel to the moving direction. The annular permeable region 21 includes: two first sub-regions which constitute the first sides of the quadrangular shape, and two second sub-regions 21b which constitute the second sides of the quadrangular shape. For example, the second sub-regions are arranged to extend substantially parallel to the moving direction of the scrape coating device or are arranged to have a length extending in the moving direction, while the first sub-regions are arranged to extend non-parallel to the moving direction of the scrape coating device. In the embodiment illustrated in the figures, the first sub-regions serve as the adjustment sub-regions 21a. In an embodiment, the barrier sub-regions 22a, respectively located on the inner side and the outer side of the adjustment sub-region 21a, are not in contact with or are spaced from the second sub-regions 22a, so that an amount of the adhesive permeating through the second sub-regions is not increased.

In the quadrangular annular permeable region, a permeability of the adhesive permeating through the second sub-regions of which an extending direction is arranged to be parallel to the moving direction of the scrape coating device is greater, while a permeability of an adhesive permeating through the first sub-regions of which an extending direction is arranged to be non-parallel to the moving direction of the scrape coating device is smaller. The permeability of the adhesive permeating through the first sub-regions is correlated with an angle between the moving direction of the scrape coating device and the extending direction of the first sub-regions which is non-parallel to the moving direction. In other words, the larger the angle is, the smaller the permeability of the adhesive permeating through the first sub-regions is. When the first sub-regions being non-parallel to the moving direction are specifically first sub-regions being perpendicular (i.e. at an angle of 90°) to the moving direction as shown in FIGS. 3 and 4, the permeability of the adhesive permeating through the first sub-regions is the smallest and accordingly smaller than that permeating through first sub-regions being at an angle greater than 0° and less than 90° to the moving direction.

Therefore, the thickness of the second film 24 may be adjusted according to the angle between the moving direction of the scrape coating device and the extending direction of the first sub-regions which is non-parallel to the moving direction of the scrape coating device, so as to adjust an entire thickness of a printed pattern, achieving an effect that the entire thickness is uniform.

For example, a width of each of the barrier sub-regions 22a in the moving direction of the scrape coating device may be greater than or equal to 0.2 mm to ensure that each of the barrier sub-regions 22a has a sufficient width to be coated with the second film 24. In an example, a spacing (indicated by L in the figures) between the barrier sub-regions 22a and each of the second sub-regions where it is not necessary to increase the permeability is greater than 0.5 mm.

Figure 5:
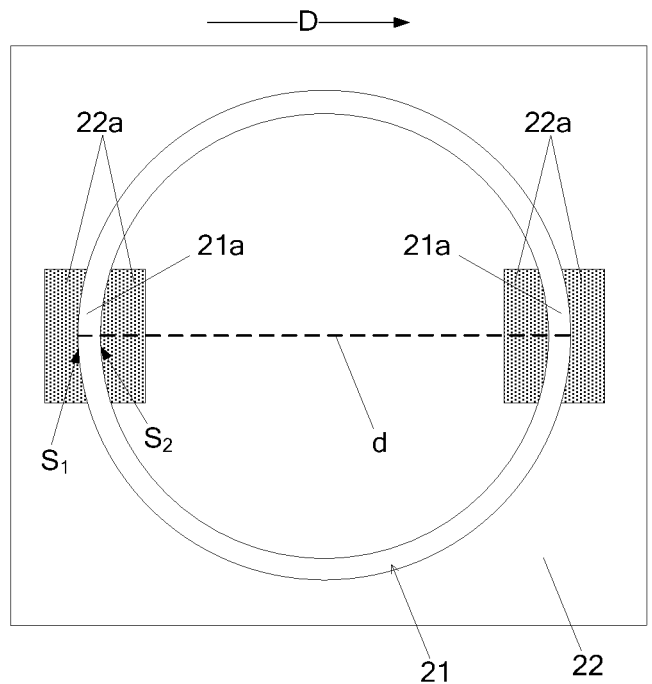
FIG. 5 is a schematic plan view showing a structure of a printing mask according to a further embodiment of the present disclosure.

In another embodiment, referring to FIG. 5, the annular permeable region 21 is a circular annular permeable region. An outer ring of the circular annular permeable region has a first diameter (illustrated in the dashed line d in FIG. 5) arranged to be parallel to the moving direction (indicated by the arrow D in FIG. 5) of the scrape coating device. The outer ring includes two first inferior arcs (indicated by S1 in FIG. 5) opposite to each other and intersecting the first diameter or a straight line in which the first diameter is located, and an inner ring of the circular annular permeable region includes two second inferior arcs (indicated by S2 in FIG. 5) opposite to each other and intersecting the first diameter or the straight line in which the first diameter is located. The adjustment sub-region 21a is at least one of two regions, each of which is formed by the first inferior arc S1 and the second inferior arc S2. For example, one adjustment sub-region is defined by the first inferior arc S1 and the second inferior arc S2 opposite to each other on the left side in FIG. 5, and the other adjustment sub-region is defined by the first inferior arc S1 and the second inferior arc S2 opposite to each other on the right side in FIG. 5.

Here, the annular permeable region 21 is a circular annular permeable region. Therefore, an edge of a profile, close to the adjustment sub-region 21a, of each of the barrier sub-regions 22a includes: a concave (for example outwards depressed) arc overlapping the outer ring of the circular annular permeable region, and a convex (for example outwards protruded) arc overlapping the inner ring of the circular annular permeable region, as shown in FIG. 5.

In an actual printing process, a thickness of a printed adhesive pattern may be detected and lengths of the first inferior arc S1 and the second inferior arc S2 are flexibly adjusted according to actual requirements. There is no limitation on the lengths in the embodiments.

Figure 6:
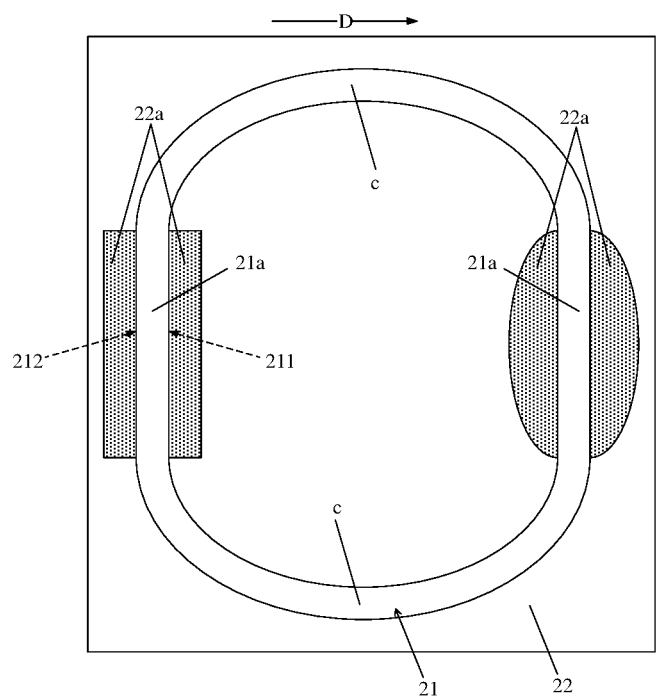
FIG. 6 is a schematic plan view showing a structure of a printing mask according to still another embodiment of the present disclosure.

In still another embodiment, referring to FIG. 6, the annular permeable region 21 is a annular permeable region constituted by a combination of arc-shaped segments and straight line-shaped segments, and the annular permeable region 21 includes two straight line-shaped segments opposite to each other and arranged to be non-parallel to the moving direction (indicated by the arrow D in FIG. 6) of the scrape coating device, and two arc-shaped segments (indicated by c in FIG. 6) connecting the two straight line-shaped segments and opposite to each other. The adjustment sub-region is at least one of the two straight line-shaped segments.

Here, for the sake of simplification, FIG. 6 illustrates only the two straight line-shaped segments arranged to be perpendicular to the moving direction of the scrape coating device.

Embodiments of the present disclosure further provide a method of printing an adhesive pattern. The method includes, but not limited to, the following steps.

In a step S1, the printing mask is superposed over a substrate to be printed, so that the annular permeable region of the printing mask corresponds to a printed region on the substrate to be printed. For example, the annular permeable region of the printing mask is aligned with the printed region in a vertical direction. One side of the printing mask on which the second film is provided faces towards the substrate to be printed.

In a step S2, an adhesive is coated on the other side of the printing mask on which the first film is provided.

In a step S3, a scrape coating device is moved in a direction which is non-parallel to the adjustment sub-region to scrape-coat the adhesive so that the adhesive permeates through the annular permeable region onto the substrate, thereby forming the adhesive pattern in the printed region.

For example, the adhesive may be a glass glue which may be used to form a frame sealing adhesive for packaging a liquid crystal layer in a display product.

The method may further include a step S4 of separating the printing mask from the substrate after the adhesive pattern is formed.

The above contents are only the specific embodiments of the present disclosure. However, the protection scope of the present disclosure is not limited thereto. Changes or substitutions that can be easily conceived by any person skilled in the art within the technical scope disclosed in the present disclosure should be contained within the protection scope of the present disclosure. Therefore, the protection scope of the present disclosure should be defined by the protection scope of the claims.

What is claimed is:

1. A printing mask comprising:
a screen comprising: an annular permeable region through which an adhesive permeates; and a barrier region which surrounds the annular permeable region and stops a permeation of the adhesive through the barrier region, the annular permeable region comprising an adjustment sub-region configured to increase a permeability of the adhesive, and the barrier region comprising barrier sub-regions respectively located on an inner side and an outer side of the adjustment sub-region;
a first film covering a side of the barrier region; and
a second film covering sides of the barrier sub-regions facing away from the first film.

2. The printing mask of claim 1, wherein:
an edge of a profile of each of the barrier sub-regions and an edge, close to the edge of the profile of the each of the barrier sub-regions, of a profile of the adjustment sub-region are completely coincident with each other.

3. The printing mask of claim 1, wherein:
an orthogonal projection of the first film on a plane where the screen is located and an orthogonal projection of the barrier region on the plane are completely coincident with each other; and/or
an orthogonal projection of the second film on the plane where the screen is located and an orthogonal projection of the barrier sub-regions on the plane are completely coincident with each other.

4. The printing mask of claim 1, wherein:
the annular permeable region has a quadrangular shape, and the quadrangular shape comprises: two first sides arranged to be non-parallel to a moving direction of a scrape coating device; and two second sides arranged to be parallel to the moving direction; and
the annular permeable region comprises: two first sub-regions which define the first sides of the quadrangular shape and at least one of which serves as the adjustment sub-region; and two second sub-regions which define the second sides of the quadrangular shape.

5. The printing mask of claim 4, wherein:
the barrier sub-regions respectively located on the inner side and the outer side of the adjustment sub-region are spaced from the second sub-regions.

6. The printing mask of claim 4, wherein:
a thickness of the second film is set according to angles between the first sides and the moving direction arranged to be non-parallel to the first sides.

7. The printing mask of claim 4, wherein:
a width of each of the barrier sub-regions measured in the moving direction is greater than or equal to 0.2 mm, and/or a spacing between the barrier sub-regions and each of the second sub-regions is greater than 0.5 mm.

8. The printing mask of claim 1, wherein:
the annular permeable region comprises a circular annular permeable region, an outer ring of the circular annular permeable region has a first diameter arranged to be parallel to a moving direction of a scrape coating device and comprises two first inferior arcs intersecting the first diameter and opposite to each other, and an inner ring of the circular annular permeable region comprises two second inferior arcs intersecting the first diameter and opposite to each other; and the adjustment sub-region comprises at least one of two regions defined by the first inferior arcs and the second inferior arcs.

9. The printing mask of claim 1, wherein:

the annular permeable region comprises a annular permeable region constituted by a combination of arc-shaped segments and straight line-shaped segments, and the annular permeable region comprises two straight line-shaped segments opposite to each other and arranged to be non-parallel to a moving direction of a scrape coating device, and two arc-shaped segments connecting the two straight line-shaped segments and opposite to each other; and the adjustment sub-region comprises at least one of the two straight line-shaped segments.

10. The printing mask of claim 1, wherein:

the second film has a thickness of 2 μm-25 μm.

11. The printing mask of claim 1, wherein a material of the second film comprises an emulsion that is incapable of reacting with an adhesive to be printed.

12. The printing mask of 1, wherein:

a material of the first film is the same as a material of the second film.

13. A method of printing an adhesive pattern, comprising:

aligning the annular permeable region of the printing mask of claim 1 with a printed region on a substrate to be printed, wherein one side of the printing mask on which the second film is provided faces towards the substrate to be printed;

coating an adhesive on the other side of the printing mask on which the first film is provided; and moving a scrape coating device in a direction which is non-parallel to the adjustment sub-region to scrape-coat the adhesive so that the adhesive permeates through the annular permeable region onto the substrate, thereby forming the adhesive pattern in the printed region.

14. The method of claim 13, wherein:

the adhesive comprises a glass glue.

15. The method of claim 13, further comprising:

separating the printing mask from the substrate after the adhesive pattern is formed.

16. The printing mask of claim 1, wherein:

the second film is configured to increase a depth of the adjustment sub-region in a thickness direction of the printing mask.

17. A arrangement for printing an adhesive pattern, comprising:

the printing mask of claim 1; and a scrape coating device configured to move in a direction which is non-parallel to the adjustment sub-region to scrape-coat the adhesive so that the adhesive permeates through the annular permeable region onto a substrate, thereby forming the adhesive pattern on the substrate.

* * * * *